United States Patent [19]

Kikuchi

[11] 4,058,800
[45] Nov. 15, 1977

[54] IMAGE PICKUP ELEMENT AND SYSTEM UTILIZING MAGNETIC BUBBLES

[75] Inventor: Yoshiki Kikuchi, Ebina, Japan

[73] Assignee: Fuji Xerox Co. Ltd., Tokyo, Japan

[21] Appl. No.: 637,141

[22] Filed: Dec. 3, 1975

[30] Foreign Application Priority Data

Dec. 3, 1974    Japan ............................ 49-137738

[51] Int. Cl.$^2$ ............................................ G11C 19/08
[52] U.S. Cl. .......................................... 365/3; 365/27; 365/39; 365/40; 358/213
[58] Field of Search ................................. 340/174TF

[56] References Cited

U.S. PATENT DOCUMENTS

| | | | |
|---|---|---|---|
| 3,526,883 | 9/1970 | Tabor | 340/174 TF |
| 3,798,622 | 3/1974 | O'Dell | 340/174 TF |

OTHER PUBLICATIONS

AIP Conference on Magnetism & Magnetic Materials; Dec. 3-6, 1974; San Francisco, Calif., pp. 620-623.

*Primary Examiner*—James W. Moffitt
*Attorney, Agent, or Firm*—Gerald J. Ferguson, Jr.; Joseph J. Baker

[57] ABSTRACT

A photomagnetic image pickup element and system, the element comprising a thin film of magnetic material capable of having magnetic bubbles formed therein where the intensity of the magnetic-bubble collapse field varies with temperature; a first conductor pattern disposed on one side of the thin film; and a second conductor pattern disposed either on the one side or on the other side of the thin film, the first and second conductor patterns being so disposed with respect to one another as to form a lattice shape on the thin film.

3 Claims, 11 Drawing Figures

IMAGE PICKUP ELEMENT AND SYSTEM UTILIZING MAGNETIC BUBBLES

BACKGROUND OF THE INVENTION

1. Field of the Invention

The present invention relates to an image pickup element and system for converting an optical image of character or the like into a magnetic-bubble pattern.

Heretofore, image pickup tubes using photoelectric transducers have been principally employed. In this type of pickup tube, however, there exist certain disadvantages such as susceptibility to mechanical shock, a complicated structure, and difficulty in attaining a compact structure. Further, the output signal obtained is serial.

SUMMARY OF THE INVENTION

A primary object of the invention is to provide an improved image pickup element and system utilizing magnetic bubbles which eliminates the disadvantages of the prior art as discussed above.

The image pickup element of this invention utilizes magnetic bubbles to convert an optical image into a magnetic-bubble pattern. In particular, a magnetic thin film is employed, the intensity of the film's magnetic-bubble collapse field changing in accordance with temperature rise resulting from the absorption of irradiated light. The film is covered with a minute, lattice-shaped conductor pattern for forming a magnetic domain lattice therein, the domains being formed by the magnetic fields corresponding to the current passing through the conductor pattern. A magnetic-bubble lattice is then created by the application of a bias magnetic field. An optical image may be then projected onto the magnetic-bubble lattice to selectively annihilate the magnetic bubbles and thus product a magnetic-bubble pattern corresponding to the optical image.

Other objects and advantages of this invention will be apparent from a reading of the following specification and claims taken with the drawing.

DETAILED DESCRIPTION OF THE PREFERRED EMBODIMENT

In this specification and the following claims, a magnetic bubble denotes cylindrical magnetic domain existing under a bias magnetic field exerted in the direction perpendicular to the surface of a thin film of suitable magnetic material such as a rare earth orthoferrite, plumbite or rare earth iron-garnet. Various properties of magnetic bubbles are discussed in "Properties and Device Applications of Magnetic Domains in Orthoferrites" by A. H. Bobeck, The Bell System Technical Journal, Vol. XLVI, No. 8, October 1967, pp. 1901–1925 and "Propagation of Cylindrical Magnetic Domains in Orthoferrites" by Anthony J. Perneski, IEEE Transactions on Magnetics, Vol. Mag -5, No. 3, September, 1969. The magnetic bubble diameter changes with film thickness, bias magnetic field intensity or temperature, and the magnetic field intensity for annihilating the magnetic bubbles changes with film thickness or temperature.

As an example of the magnetic materials usable in the present invention, samarium-terbium mixed orthferrite ($Sm_{0.55} Tb_{0.45} FeO_3$) is considered. In the magnetic bubble device, it is known on BSTJ. Dec, 1969, pages 3287 to 3335 that the properties of bubble can be represented, in the normalized form, by the characteristic material length $l$, the thickness $h$ and the saturation magnetization $4\pi Ms$ and these properties do not change even when the magnetic material is changed.

For $Sm_{0.55} Tb_{0.45} FeO_3$, the bubble diameter $d$ and the collapse magnetic field Hco are changed with temperature in which Hco is abruptly decreased with increase of temperature in a room temperature range (290° K to 350° K). See "Temperature Dependence of Rare-Earth Orthoferrite Properties Relevant to Propagating Domain Device Application" by Rossol, IEEE Transaction on Mag., vol. MAG-5, No. 3, September, 1969, in which, at the room temperature range (290° K–350° K) the magnetic bubble domain properties in a SmTb mixed orthoferrite thin film are such, when the thickness of the thin film is about 40μ, that the diameter of magnetic bubble under a bias magnetic field, $H_{bias}$ of 58 Oersteds (Oe) is about 30μ at 300° K and the magnetic bubble collapse field, and the magnetic bubble strip-out field, $H_S$, are 64 Oersteds and 50 Oersteds at 300° K, resectively. The magnetic bubble collapse field, Hco decreases with increase of temperature and is about 55 Oe at 320° K. This means that when the bias field is 58 Oe, the magnetic bubbles existing in the magnetic thin film collapse with an increase in temperature from 300° K to 320° K. At 300° K, if the bias magnetic field becomes lower than magnetic bubble stripout field, 50 Oe, the magnetic bubbles existing in the magnetic thin film strip out. The effect that the magnetic bubbles strip out is also caused by local decrease of the bias magnetic field in the magnetic thin film.

Figure 1:
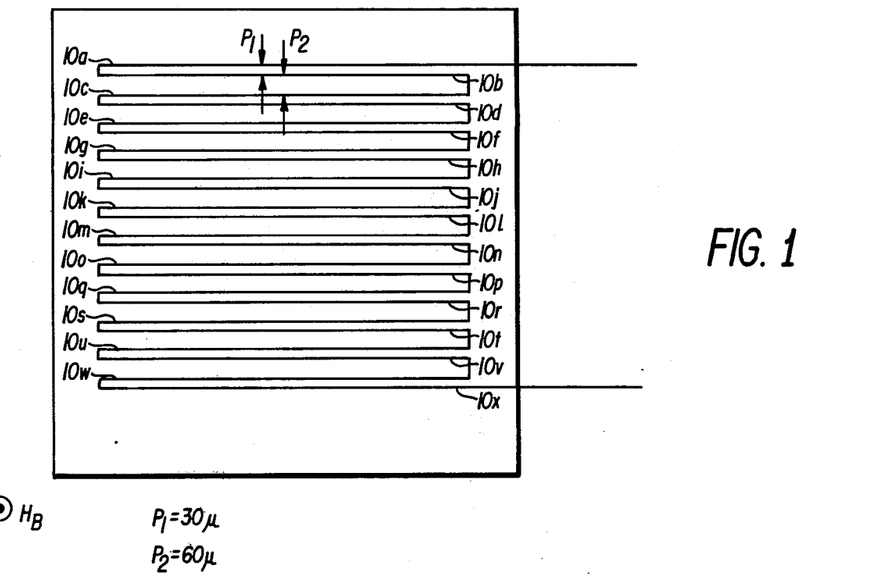
FIG. 1 is a plane view of a conductor pattern in accordance with the invention.
Figure 8:
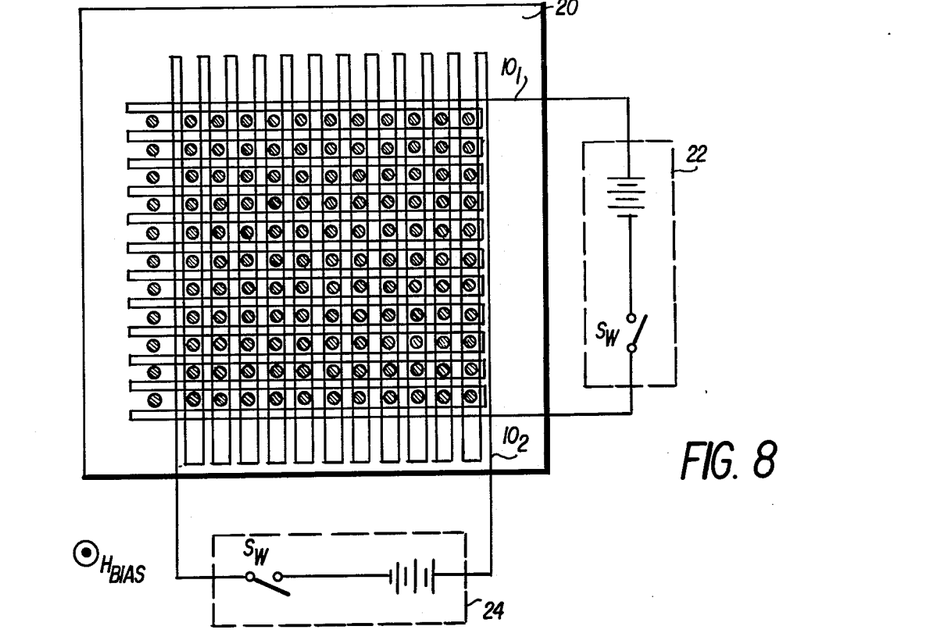
FIG. 8 shows a resultant magnetic bubble lattice.

When a pair of bubbles are coexisting with a small distance therebetween, an expelling force interacts on both bubbles. The distance which the bubbles are free from a translational force is known to be larger than $3d$ where $d$ is the diameter of the magnetic bubble. Therefore, by setting the bias field H bias to 58oe so that the diameter $d$ becomes 30μ and by selecting the distance between the adjacent bubbles forming the bubble lattice as $3d$, a sum of the narrow pitch portion $P_1$ and the wide pitch portion of $P_2$ of the pattern $10_1$, or $10_2$ as shown in FIG. 1 or 8, is set 3d. $P_1$ and $P_2$ may be set, in a particular embodiment to 30µ and 60µ, respectively.

In this case, the width of the conductor is determined as 15µ according to Goldstein et al. "Bubble Forces in Cylindrical Magnetic Domain Systems", J. Appl. Phys. vol. 44, No. 11, November 1973 if the conductor's width is less or equal to a magnetic bubble radius, the force on a magnetic bubble from a conductor pattern may be approximated by zero-width connected current carrying segments.

Figure 2:
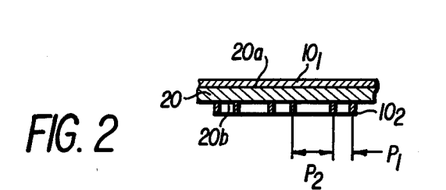
FIG. 2 is a sectional view of an image pickup element in accordance with the invention.
Figure 3:
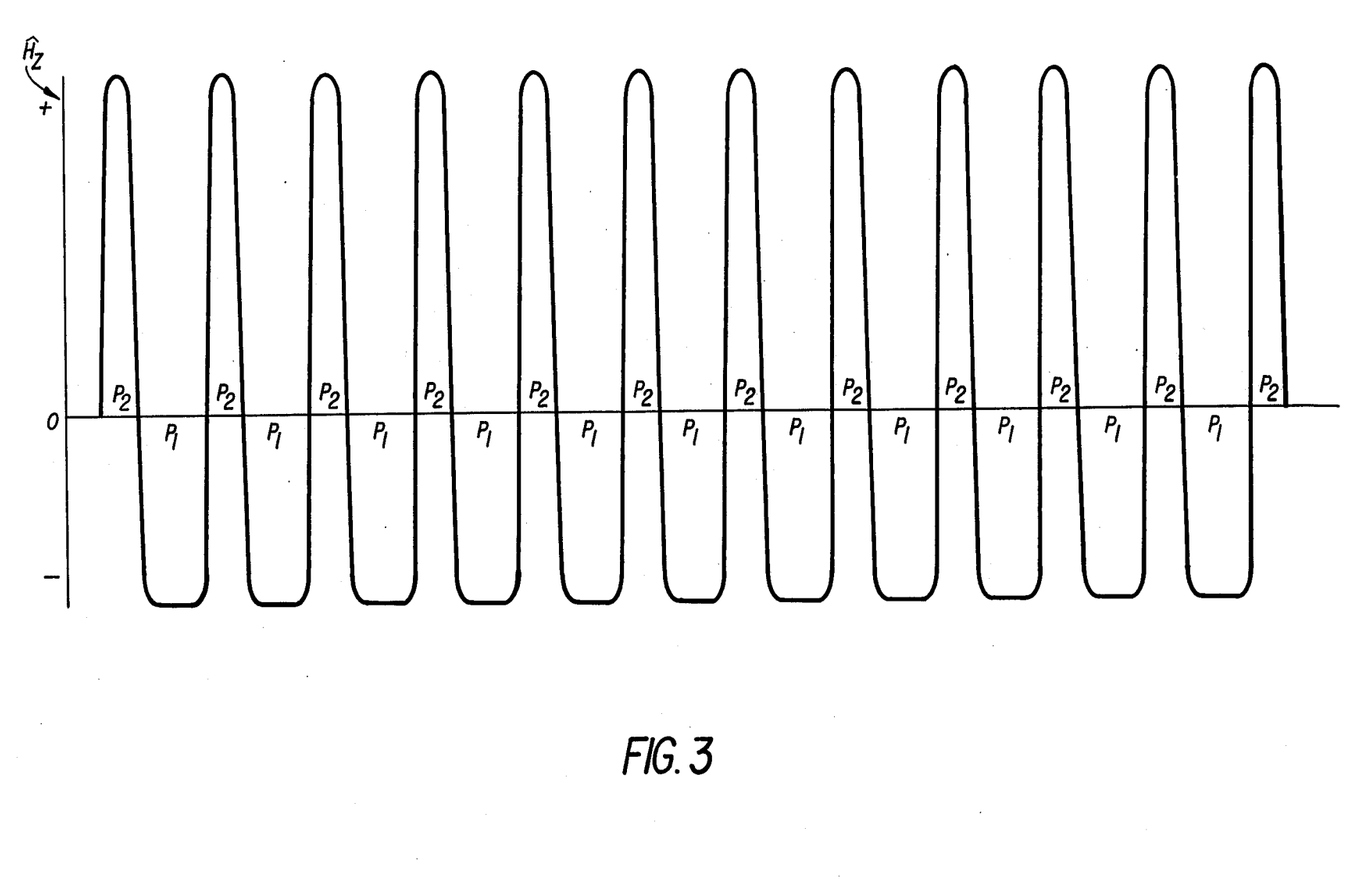
FIG. 3 is a magnetic field distribution in a magnetic thin film produced by an application of current pulse applied to one conductor pattern.
Figure 4:
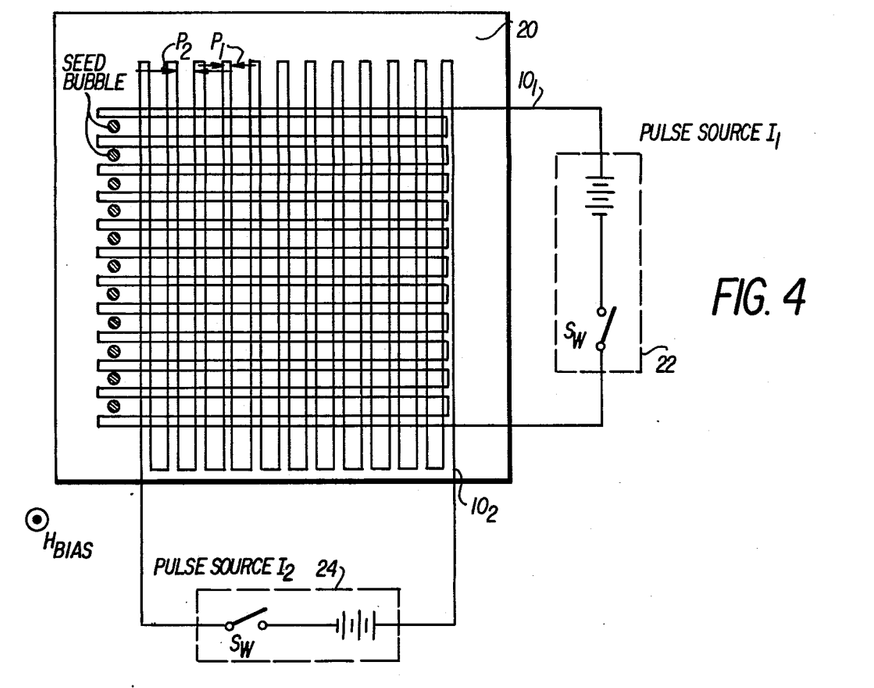
FIG. 4 is a plane view of a magnetic image pickup element, showing a setting of seed bubbles.

In the image pickup element according to the present invention, a conductor pattern 10 such as shown in FIG. 1 may be provided on both sides of a magnetic thin film in an orthogonal relationship with each other as shown in FIGS. 2 and 4 to form a lattice structure. As will be explained in further detail hereinafter, when currents are applied independently with respect to each other to the orthogonal conductor patterns, a magnetic field configuration corresponding to the patterns is produced. Each conductor pattern comprises a plurality of parallel conductor elements 10a, 10b, 10c, 10d, 10e, 10f, 10g, 10h, . . . 10x, the pitch between successive elements alternately being $P_1$ and $P_2$ where pitch $P_2$ is substantially greater then pitch $P_1$. Although conductor patterns $10_1$ and $10_2$ are each shown as single conductors consisting of continuous elements, the conductor elements 10a–10x may each be driven by separate current sources if desired. Since each conductor pattern is cyclical having a narrow-pitch portion $P_1$ and a wide-pitch portion $P_2$, a striped mean magnetic field configuration as shown in FIG. 3, which is produced by one conductor pattern and is perpendicular to the surface of the magnetic thin film, intersects a striped means magnetic field configuration in the orthogonal direction generated by the other conductor pattern, thereby producing insular magnetic fields configuration in the overlapped portions of the wide pitch portion $P_2$ of the conductor patterns. As will be explained in detail hereinafter, the fields are super-imposed to a bias field to establish the magnetic-bubble lattice. In FIG. 1, the conductor pattern 10, is to form an 11 × 11 bubble lattice and the member of the parallel conductor elements 10a to 10x is twenty-four. This conductor pattern is formed on a substrate of such as glass by using the etching technique. The resultant pattern is put on an upper surface of the magnetic thin film in an intimate contact therewith. Thereafter, when an electric current is supplied, a magnetic field is produced in the magnetic thin film.

FIG. 3 shows a magnetic field distribution in the film with a current flowing through a conductor pattern. In this figure, the vertical axis is the magnetic field component Hz in the direction normal to the film surface, averaged with respect to the film thickness. As shown in FIG. 3, the direction of the bias magnetic field is defined as the plus direction. The peak values of the magnetic fields produced in the respective narrow and wide pitch portions $P_1$ and $P_2$ are + 73oe and − 41oe, respectively, when a current of one ampere is flown through the conductor pattern. That is, the value of the magnetic field produced in the narrow pitch portion $P_1$ is about 1.8 times that produced in the wide pitch portion $P_2$.

The directional relation between the enternal magnetic field including the bias magnetic field and the field produced by the current flowing through the conductor pattern and the magnetization in the magnetic thin film is in just reverse to that between the bias magnetic field and the magnetization of the cylindrical magnetic domain (bubble). The bias magnetic field range within which the bubble is stabilized is from the strip-out magnetic field + 50oe to the bubble collapse magnetic field + 64eo in this range and within which the bubble diameter is reduced with increase of the bias magnetic field. The direction of the bias magnetic field H bias is shown as coming in through the paper sheet, in FIG. 4. In this case, the upper portion and the lower portion of the bubble in the magnetic film corresponds to S and N poles respectively.

The method of producing the magnetic bubble lattice will be described with reference to the drawings. Firstly, a bias magnetic field of + 58oe which is within the bubble stabilizing range is applied to the surface of the magnetic thin film in the direction normal to the surface by a bias field source such as a Helmholtz coil to set up seed bubbles in an end areas of the wide pitch portions $P_2$ of the conductor pattern 10, as shown in FIG. 4. A simple means for setting up the seed magnetic bubbles is as follows: the magnetic bubbles can be observed visually utilizing magneto-optic effects — that is, for example, when linear polarized light vertical to the plane of the thin film of the magnetic bubble material is transmitted through or reflected, the plane of the linear polarized light rotates clockwise or counterclockwise depending on the direction of the magnetization in the thin film of the magnetic bubble material. Therefore the magnetic bubbles which are formed by bias magnetic field application may be guided by means of a magnetic north pole needle capable of attracting magnetic bubbles to the seed-magnetic-bubble-positions. As to the stabilization of the seed bubbles, it is advisable to provide thin film (5000A ∼ 1µ) of high permeable magnetic material on the magnetic bubble film by etching to attain magnetic bubble stabilizing position on the magnetic bubble film. This is shown as four permaloy dots in "Theory of Single — Current Domain Propagation Circuits" by Copeland, IEEE Traus. on Mag., Letters. June (1972) pages 241 to 243. It is also described in "Application of Orthoferrites to Domain-Wall Devices" by Bobeck et al, IEEE Trans. on Mag., MAG-5, No. 3, Sept. 1969, that with a presence of a magnetic bubble in the stabilizing position, the bubble collapse magnetic field becomes larger than that required to collapse free bubble by a few Oersteds.

Figure 5:
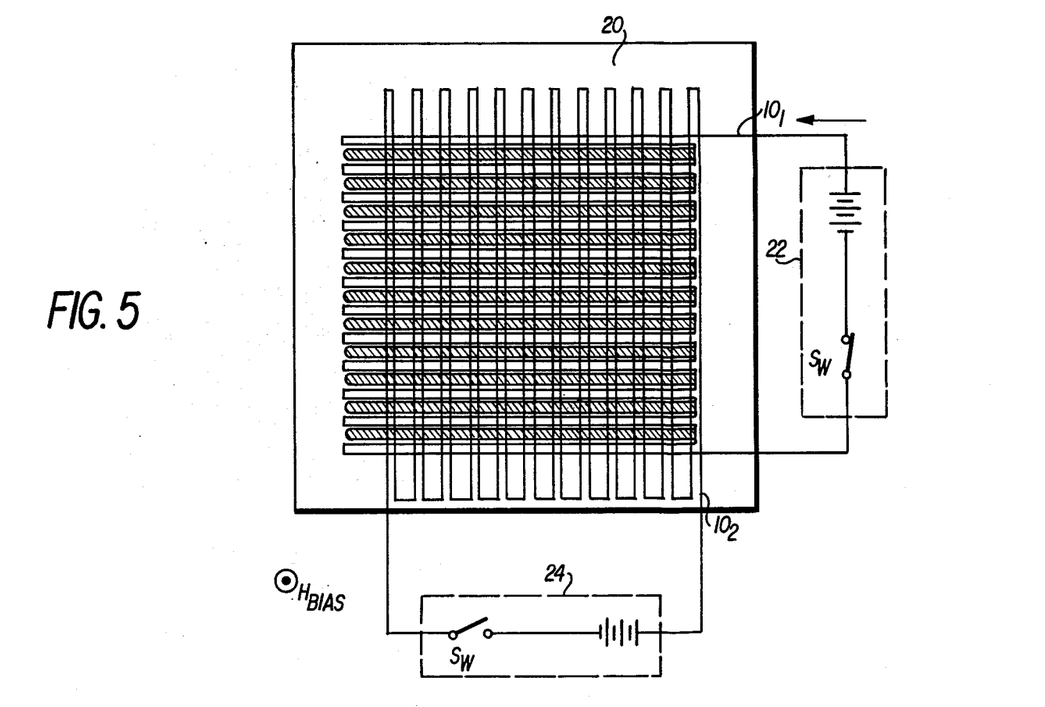
FIG. 5 is a plane view of a magnetic image pickup element, showing a production of strip domains from the seed bubbles in FIG. 4.

After the seed bubbles are setup, a current of about 0.5 amperes is flown to the conductor pattern 10, in the arrow direction in FIG. 5 by closing a switch Sw of a pulse current source 22. Due to the current, the magnetic field is produced in the magnetic thin film in the magnetic field distribution shown in FIG. 3. In this case, the magnetic field produced in the wide pitch portion $P_2$ of the conductor pattern $10_1$, has a direction reverse to that of the bias magnetic field (+ 58 Oersteds). Therefore the bias magnetic field in this portion becomes 38 oersteds because the field in the pitch portion $P_2$ is − 20 oersteds. Since the strip out magnetic field Hs is 50 oersteds, the bias magnetic field is smaller enough than the strip out field, and therefore, the seed bubbles are stripped out to positions in the magnetic thin film corresponding to the wide pitch portions $P_2$ of the conductor pattern $10_1$, as shown in FIG. 5 since the direction of the magnetic field of the narrow pitch portions $P_1$ of the conductor pattern $10_1$ is as same as that of the bias magnetic field, the strip-out domains don't trespass on the portions in the thin magnetic film corresponding to the narrow pitch portions $P_1$ of the conductor pattern $10_1$. The distance of extension of the stripped-out domain depends upon the wave height values of electric current pulse flowing through the conductor pattern $10_1$, and the width of the pulse. The distance required for the 11 × 11 bubble lattice is about 1mm where the wave height is 0.5 ampere and the width is $10^{-3} \sim 10^{-5}$ seconds.

Figure 6:
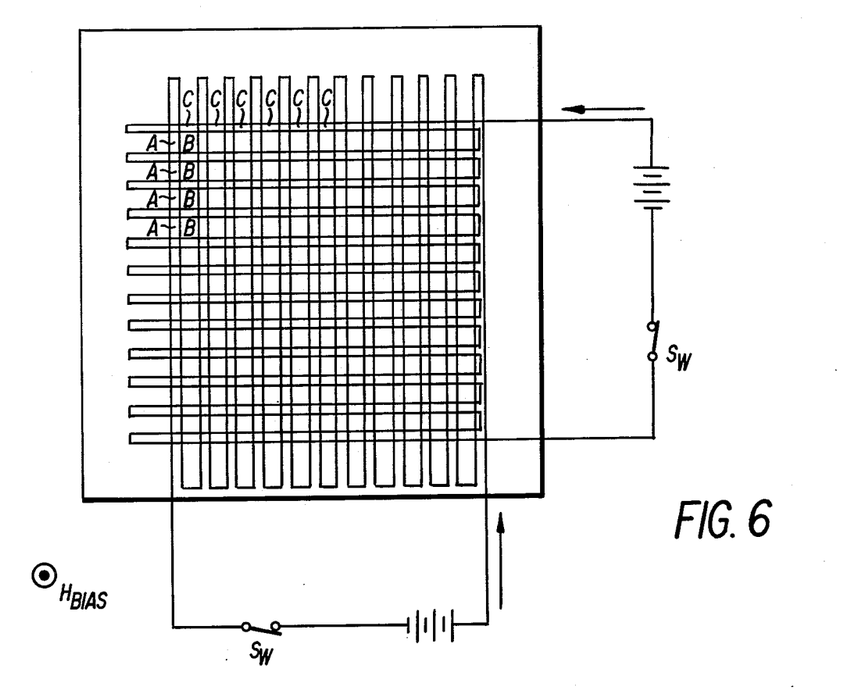
FIG. 6 is a plane view of a magnetic image pickup element illustrating three area groups for explanation.
Figure 7:
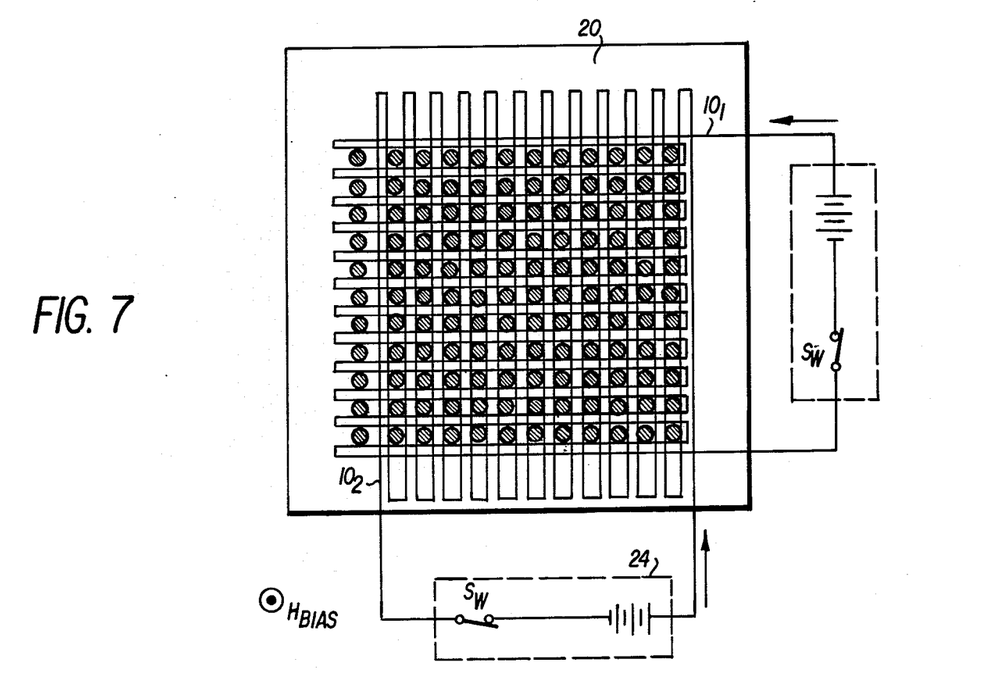
FIG. 7 is a plane view of a magnetic image pickup element, showing insular domains produced from the strip domains by dividing the latter.

After the strip domains are aligned as shown in FIG. 5, a current is flown through the conductor pattern $10_2$ in the arrow direction as shown in FIG. 6 by closing a switch Sw of a pulse source 24. In the magnetic bubble device, a production of new bubbles are made by dividing the seed bubbles as is well known. For Samorium-terbium mixed orthoferrite, it is shown in the article of Bobeck et al that the bubble dividing magnetic field is 37.5 oersteds. The distribution of the magnetic field produced in the magnetic film by the current flowing through the conductor pattern $10_2$ is shown in FIG. 3. Since the patterns $10_1$ and $10_2$ are orthogonal, the distribution of the composite magnetic field becomes somewhat complicated. For explanatory purpose, overlapping portions of the two patterns are shown by portions A, B and C. As shown in FIG. 6, the portion A shows a portion where the wide pitch portion $P_2$ of the pattern $10_1$ and the narrow pitch portion $P_1$ of the pattern $10_2$ are overlapped, the portion B shows a portion where the wide pitch portions $P_2$ of the patterns $10_1$ and $10_2$ are overlapped and the portion C is a portion where the narrow pitch portion $P_1$ of the pattern $10_1$ and the wide pitch portion $P_2$ of the pattern $10_2$ are overlapped. The magnetic fields produced in the magnetic film portions corresponding to these overlapped portions by the currents flowing through the patterns $10_1$ and $10_2$ are denoted by $H_A$, $H_B$ and $H_C$. When a current of 0.9 amperes flows through the pattern $10_2$, $H_A$ is a summation of − 20 oersteds (the field produced in the wide pitch portion of the pattern $10_1$) and + 66 oersteds (the field produced in the wide pitch portion of the pattern $10_2$) and, therefore, is + 44 oersteds. The latter is larger than the bubble dividing magnetic field, so that each of the aligned strip domains are cut at the respective portions A causing insular domains as shown in FIG. 7. The reason for that there is no bubble produced even when the bias magnetic field is applied is that the field $H_B$ in the portion B where the insular domain exist becomes − 57 oersteds which substantially cancells the biasing magnetic field therein. A magnetic field $H_C$ in the portion C is substantially zero. Because the field of the narrow pitch portion $P_1$ of the conductor pattern $10_1$ and the field of the wide pitch portion $P_2$ of the conductor pattern $10_2$ are in the opposite directions having the approximately same value, the bias magnetic field $H_{bias}$ is unaffected in this portion. The width of the current pulse flowing through the conductor pattern $10_2$ is $10^{-3} - 10^{-6}$ seconds. After the production of the insular domains in this manner, the currents flowing through the patterns $10_1$, and $10_2$ respectively are cutout, resulting in a bubble lattice shown in FIG. 8.

Figure 9:
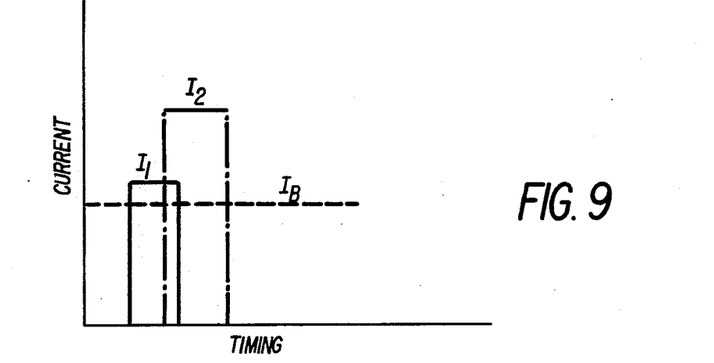
FIG. 9 illustrate the timing of application of current pulses to the conductor patterns and of biasing current.

Referring to FIG. 9, another method which may be used for aligning the magnetic strip domains is as follows. Current is applied to conductor pattern $10_1$ while the bias magnetic field, $H_{bias}$, is decreased to less than the strip-out field, 50 Oe. Therefore the seed magnetic bubbles as shown in FIG. 4 strip out to the wide pitch portions $P_2$ of the conductor pattern $10_1$ following the magnetic field configuration of the corresponding portion in the magnetic thin film produced by the current flowing through the conductor pattern $10_1$ as shown in FIG. 3 because the direction of magnetization of the strip-out magnetic domain is as the same as that of the magnetic field of the wide pitch portion $P_2$, but is opposite to that of the magnetic field of the narrow pitch portion $P_1$. Current pulses applied to conductor patterns $10_1$ and $10_2$ are adjusted as shown in FIG. 9. In FIG. 9, $I_1$ is a current pulse applied to upper conductor pattern $10_1$, $I_2$ is a current pulse applied to lower conductor pattern $10_2$ and $I_B$ is a current applied to a loop or the like to generate a bias magnetic field. In this case that the bias magnetic field is decreased to zero, $I_A$ is much or less lower than 0.5 Amperes but $I_B$ is much or less larger than 0.9 Amperes.

The fact that the current value of $I_B$ is lowered in the duration of $I_1$ promotes an enlargement of the strip domains.

Although the above description refers to an embodiment where upper and lower conductor patterns $10_1$ and $10_2$ sandwich the top and bottom surfaces $20a$ and $20b$ of magnetic thin film 20, it is of course possible to attain the above results by a pair of orthogonal conductor patterns $10_1$ and $10_2$ disposed on only one surface of magnetic thin film 20.

The magnetic thin film of the present invention is made of a material such as samarium-terbium-mixed orthoferrite in which the magnetic field, intensity needed to annihilate magnetic bubbles changes sharply with temperature fluctuation. Assuming the magnetic bubble collapse field intensity at temperature $K_1$ is $(H_{CO})K_1$ and the magnetic bubble collapse field intensity at temperature $K_2$ is $(H_{CO})K_2$, the bias magnetic field intensity $H_{bias}$ is so set as to satisfy the following relationship assuming $K_1$ is lower than $K_2$:

$$(H_{CO})K_1 > H_{bias} > (H_{CO})K_2 \qquad (1)$$

By selective raising of the temperature from $K_1$ to $K_2$, the magnetic bubbles are selectively annihilated in the portions where the temperature has been raised. Example for, $K_1$ is 300° K, $K_2$ is 320° K, $(H_{co})K_1$ is 64 Oersteds, $(H_{co})K_2$ is 55 Oersteds, and $H_{bias}$ is 58 Oersteds, respectively.

Figure 10:
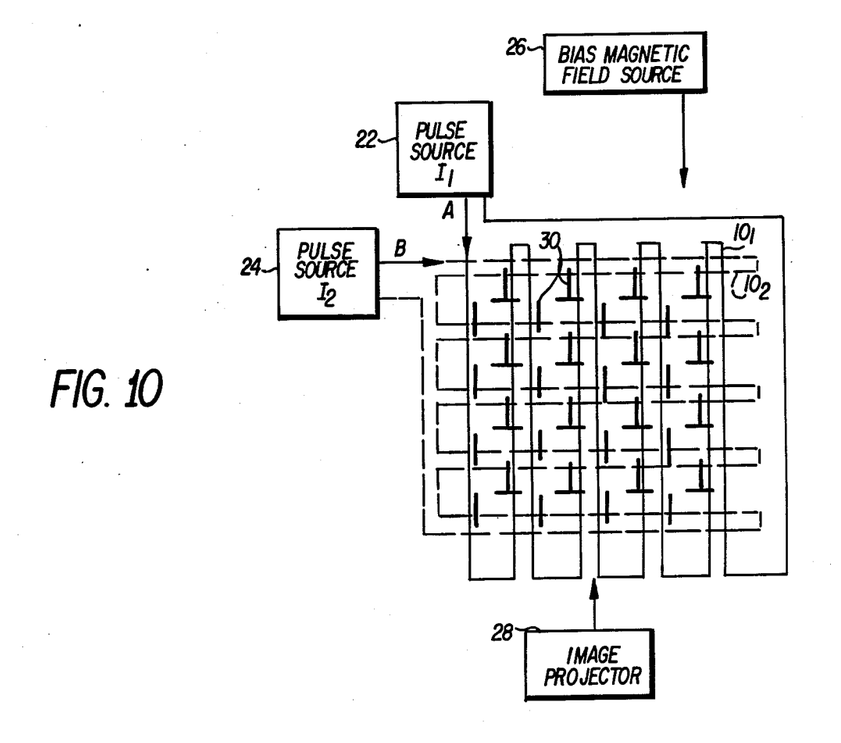
FIG. 10 is a plane view of a magnetic bubble pattern propagation circuit.

Therefore, after magnetic bubble lattice is generated as aforesaid on the above-stated image pickup element, an optical image of a character, figure or the like is focused by projector 28 on the surface of the magnetic thin film as shown in FIG. 10. By the selective temperature rise resulting from the selective absorption of irradiated light, magnetic bubble collapse field in the light-irradiated portion is lowered in intensity of magnetic field compared to the bias magnetic field. Hence, in accordance with Equation (1) annihilation of the light-irradiated magnetic bubbles is effected and the optical image is converted into a magnetic-bubble pattern. For the Sm-Tb mixed orthoferrite, the amount of image radiation light is about 50mj/mm² and the wave length of the light is within the absorption range of the magnetic thin film (equal to or shorter than about 6000 A).

Figure 11:
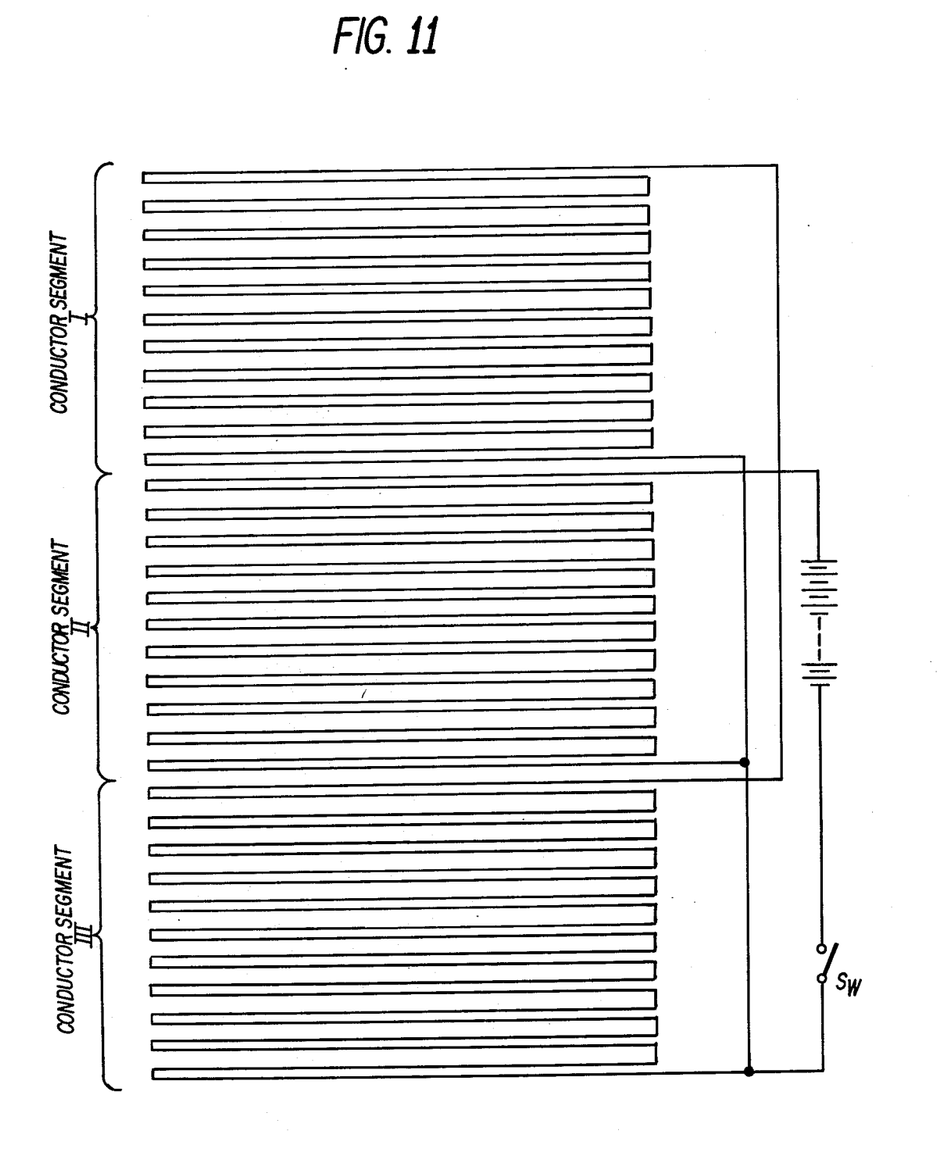
FIG. 11 is an example of the conductor pattern driving methods for increasing the number of conductor elements.

The magnetic-bubble pattern thus formed can be propagated in any direction desired through a propagation circuit 30 shown in FIG. 11 and is usable also as an input to a device utilizing magnetic bubbles. Furthermore, the magnetic bubble pattern can be converted into an electrical signal by the Hall effect or the magnetic reluctance effect. Also easy conversion into a serial or parallel signal is achieved. The aforementioned articles disclose various devices for propagating and utilizing magnetic bubbles. It is easy to increase the number of lattice points, i.e., bubbles, in the bubble lattice. For example, if the number of the conductive elements of the conductor pattern is increased to 66, the active area of the lattice becomes about 3mm × 3mm and the bubble lattice is 32 × 32.

When the number of the conductive elements is increased and the length of the conductive element is increased, the resistance of the conductor is increased accordingly. However, by dividing the conductor pattern into a plurality of conductor segments as shown in FIG. 11 and driving these segments in parallel, the increase of electric resistance can be avoided.

The resolution of the image pickup element using magnetic bubble depends upon the bubble diameter and therefore, in order to increase the resolution it is usual to make the bubble diameter as small as possible and to use a bubble material having properties that the bubble collapse magnetic field is reduced with temperature increase. As an example, a mixture garnet represented by $Eu_{1.7}Er_{1.3}Al_{0.7}Ga_{0.8}Fe_{3.5}O_{12}$ is suitable as the bubble material. The characteristic material length of the mixture garnet is 0.75 $\mu$ at 300° K and the bubble diameter is about 6 $\mu$. The bubble collapse magnetic field is about 52 oersteds at 300° K and decreases to about 37 oersteds at 313° K, showing a large temperature dependency, as described in "The temperature dependence of the anisotropy field and Coercivity in epitaxial films of mixed rare-earth iron garnets", by Shumate Jr. et. al, J. Appl. Phys., vol. 44, No. 1, January 1973. It becomes possible, when this material is used, to form a 56 × 56 bubble lattice in a magnetic thin film having area of 1 mm².

By virtue of the above-described structure, the present invention requires no sequential generation of magnetic bubbles by a magnetic bubble generator, and batch processing is possible to form a magnetic-bubble lattice by the application of current pulses to the conductor pattern 10 thereby attaining the advantages peculiar to the present invention including the reduction of processing time and less limitation on the method for propagation of the magnetic-bubble pattern.

What is claimed is:

1. A photomagnetic image pickup element comprising
    a thin film of magnetic material capable of having magnetic bubbles formed therein where the intensity of the magnetic-bubble collapse field varies with temperature;
    first conductor set disposed on one side of said thin film; and
    a second conductor set disposed either on said one side or on the other side of said thin film, said first and second conductor sets being so disposed with respect to one another as to form a lattice shape on said thin film where said first and second conductor sets are orthogonal with respect to one another and each comprises a plurality of parallel conductor elements disposed in a first direction, the pitch between successive elements alternately being $P_1$ and $P_2$ where pitch $P_2$ is substantially greater than pitch $P_1$.

2. A pickup element as in claim 1, where each said first and second conductor pattern comprises a single conductor composed of said conductor elements.

3. An image pickup system comprising
    an image pickup element including
        a thin film of magnetic material capable of having magnetic bubbles formed therein where the intensity of the magnetic-bubble collapse field varies with temperature;
        first conductor pattern disposed on one side of said thin film; and
        a second conductor pattern disposed either on said one side or on the other side of said thin film, said first and second conductor patterns being so disposed with respect to one another as to form a lattice shape on said thin film;
        said first and second conductor patterns being orthogonal with respect to one another and each comprising a plurality of parallel conductor elements disposed in a first direction, the pitch between successive elements alternately being $P_1$ and $P_2$ where pitch $P_2$ is substantially greater than pitch $P_1$;
    means for respectively applying first and second current pulses to said first and second conductor patterns to establish insular magnetic domains having a predetermined direction of magnetization only where said $P_2$ pitch portions of said first and second conductor patterns overlap;
    means for applying a bias magnetic field to said thin film, the direction of said bias magnetic field being opposite to said magnetication of said insular magnetic domains to thereby create a magnetic-bubble lattice in said thin film and $(H_{CO})K_1 > H_{bias} > (H_{CO})K_2$ where $H_{bias}$ is the intensity of said bias magnetic field, $(H_{CO})K_1$ is the field intensity required to collapse magnetic-bubbles in said thin film at temperature $K_1$ and $(H_{CO})K_2$ is the field intensity required to collapse said magnetic-bubbles at temperature $K_2$ where $K_2 > K_1$; and
    means for projecting an image of light and dark on one face of said thin film to thereby selectively raise the temperature at the light irradiated portions from $K_1$ toward $K_2$ and thus selectively annihilate the light irradiated bubbles to form a magnetic-bubble pattern in the thin film corresponding to said image.

* * * * *